United States Patent [19]

Tobin et al.

[11] Patent Number: 5,142,282
[45] Date of Patent: Aug. 25, 1992

[54] DATA COMPRESSION DICTIONARY ACCESS MINIMIZATION

[75] Inventors: Jeffrey P. Tobin; Carl B. Lantz, both of Corvallis, Oreg.; Jeff J. Kato, Greeley, Colo.

[73] Assignee: Hewlett-Packard Company, Palo Alto, Calif.

[21] Appl. No.: 610,372

[22] Filed: Nov. 7, 1990

[51] Int. Cl.⁵ .............................................. H03M 7/00
[52] U.S. Cl. ........................................ 341/55; 341/51
[58] Field of Search ..................... 341/50, 51, 55, 60, 341/87, 95, 106; 364/200, 260.6

[56] References Cited

U.S. PATENT DOCUMENTS 4,558,302 12/1985 Welch ................................. 341/51
4,814,746 3/1989 Miller et al. ....................... 341/95
4,847,619 7/1989 Kato et al. ......................... 341/106
4,881,075 11/1989 Weng ................................. 341/87
4,929,946 5/1990 O'Brien et al. .................... 341/87

OTHER PUBLICATIONS

Hewlett-Packard Company, "Mystic Data Compression IC" HP Part No. 1XB4-0301 pp. 7-36, Jul. 16, 1990.

Primary Examiner—Howard L. Williams

[57] ABSTRACT

A logic circuit in an integrated circuit implementation of an adaptive data compression algorithm which uses a RAM to store dictionary entries. The logic circuit generates predetermined codewords for single-character strings without accessing the dictionary. The logic circuit also generates single-character strings for corresponding codewords without accessing the dictionary.

2 Claims, 3 Drawing Sheets

DATA COMPRESSION DICTIONARY ACCESS MINIMIZATION

BACKGROUND OF THE INVENTION

1. Field of the Invention

The present invention relates to data compression and decompression.

2. Description of Related Art

Data compression is the reversible transformation of information into a more compact representation. This more compact representation permits the information to be stored and/or communicated more efficiently, generally saving both time and expense.

A major class of compression schemes encodes multiple-character strings using binary sequences or "codewords" not otherwise used to encode individual characters. The strings are composed of an "alphabet," or single-character strings. This alphabet represents the smallest unique piece of information the compressor processes. Thus, an algorithm which uses eight bits to represent its characters has 256 unique characters in its alphabet. Compression is effected to the degree that the multiple-character strings represented in the encoding scheme are encountered in a given file or data stream. By analogy with bilingual dictionaries used to translate between human languages, the device that embodies the mapping between uncompressed code and compressed code is commonly referred to as a "dictionary."

Generally, the usefulness of a dictionary-based compression scheme is dependent on the frequency with which the dictionary entries for multiple-character strings are used. A fixed dictionary optimized for one file type is unlikely to be optimized for another. For example, a dictionary which includes a large number of character combinations likely to be found in newspaper text files is unlikely to compress efficiently data base files, spreadsheet files, bit-mapped graphics files, computer-aided design files, et cetera.

Adaptive compression schemes are known in which the dictionary used to compress a given file is developed while that file is being compressed. Codewords representing every single character possible in the uncompressed input file are put into the dictionary. Additional entries are added to the dictionary as multiple-character strings are encountered in the file. The additional dictionary entries are used to encode subsequent occurrences of the multiple-character strings.

During decompression, the dictionary is built in a like manner. Thus, when a codeword for a character string is encountered in the compressed file, the dictionary contains the necessary information to reconstruct the corresponding character string. Compression is effected to the extent that the multiple-character strings occurring most frequently in the file are encountered as the dictionary is developing.

Adaptive compression systems and methods are disclosed in U.S. Pat. No. 4,814,746 to Miller et al. and U.S. Pat. No. 4,558,302 to Welch. These references further explain the use of dictionaries.

To avoid keeping a dictionary which no longer represents the type of data being compressed, and thus exhibits the problems described above in reference to fixed-dictionary compression schemes, the dictionary is periodically reset. These resets can occur at natural data boundaries, e.g., at the beginning of files, after a fixed amount of data has been compressed, or according to a performance-based algorithm as described in Kato, U.S. Pat. No. 4,847,619 and which is hereby incorporated by reference. These dictionary resets take time. In many instances, the reset-caused time delay will cause other resources to wait.

A typical hardware implementation of a data compression algorithm is a data compression (DC) integrated circuit (IC) which is inserted into a data stream. A data compression machine on the IC processes the data stream present at one port and routes the resulting compressed or decompressed data stream to the other port.

A DC IC may use an external memory IC, or "dictionary RAM," to store the dictionary entries used in compression and decompression. The predetermined codeword entries representing the alphabet are written to the dictionary RAM. Each time the compressor matches only a single character (a string of length 1), the codeword for the character is read from the dictionary RAM and output in the compressed stream. When the decompressor receives a codeword for a single character, it must read the dictionary RAM to get the alphabet character.

A pair of direct memory access (DMA) interfaces on the DC IC may handle the specifics of the IC's communication with the outside world. Each DMA interface has a RAM buffer for storing data yet to be passed on. For cost reasons, a single RAM IC may be used for the dictionary storage and both DMA buffers. Because the DMA interfaces operate in parallel, it is possible that both will attempt to access the single RAM IC at the same time. Although an arbitration circuit can manage such conflicts, such arbitration cannot prevent one circuit from waiting while the other circuit is given priority.

SUMMARY OF THE INVENTION

The present invention provides for a logic circuit in an integrated circuit implementation of an adaptive data compression algorithm which uses a RAM to store dictionary entries. The logic circuit generates predetermined codewords for single-character strings without accessing the dictionary. The logic circuit also generates single-character strings for corresponding codewords without accessing the dictionary.

The logic circuit eliminates the need to store codewords corresponding to single-character strings in the dictionary, freeing locations for use by other codewords and thus decreasing hashing collisions.

Furthermore, the logic circuit eliminates the need to restore codewords corresponding to single-character strings when initializing the dictionary, speeding initialization by approximately two orders of magnitude.

The logic circuit also eliminates the need to access the dictionary for predetermined codewords or single-character strings corresponding to the predetermined codewords, minimizing dictionary access and speeding compression and decompression.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENTS

Figure 1:
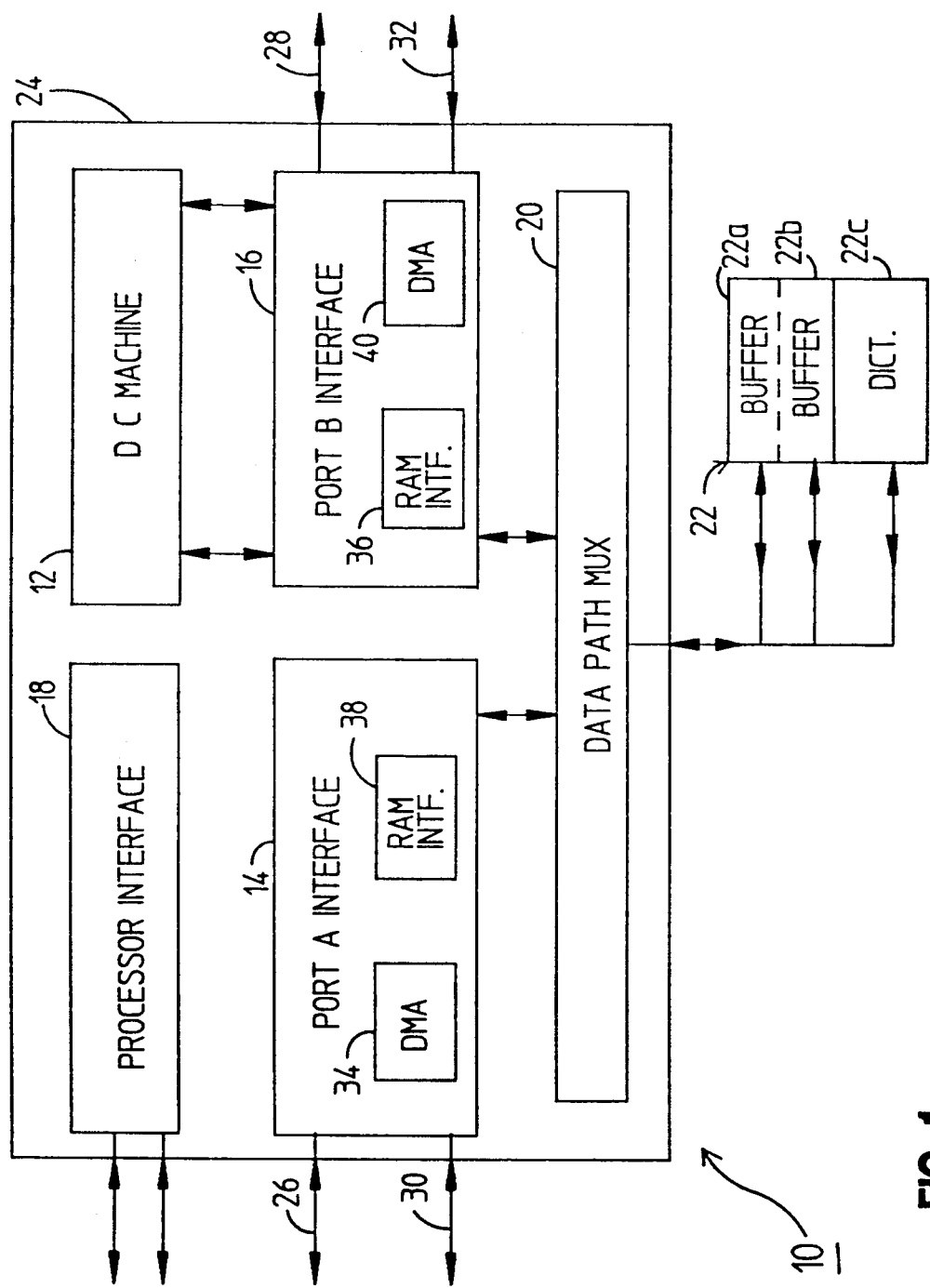
FIG. 1 is a simplified block diagram of a data compression chip according to the present invention.

The present invention provides for a hardware system implementing a data compression algorithm. Referring to FIG. 1, the system 10 includes a data compression (DC) machine 12, a Port A interface 14, a Port B interface 16, a processor interface 18, a data path multiplexer (MUX) 20 and a random-access memory (RAM) 22. All but the RAM are integrated onto a single integrated circuit (IC) 24.

The Port A and Port B interfaces 14, 16 are independent, bi-directional data links having respective data lines 26, 28 and control lines 30, 32. Each has a respective direct memory access (DMA) interface 34, 40 and an associated buffer area 22a, 22b in the external RAM 22. The Ports A and B also have RAM interface circuitry 38, 36.

In compression mode, the Port A interface 14 receives characters from the data lines 26 and supplies them via the data path MUX 20 and the Port B interface 16 to the DC machine 12. The DC machine, using the dictionary 22c in the RAM 22, converts the characters into codewords and supplies them to the Port B interface. The Port B interface provides the codewords as output on data lines 28.

In decompression mode, the Port B interface 16 receives codewords from the data lines 28 and provides them to the DC machine 12. The DC machine, using the dictionary 22c in the RAM 22, converts the codewords into characters and supplies them via the Port B interface and data path MUX 20 to the Port A interface 14. The Port A interface provides the characters as output on data lines 26.

Optionally, the Port A and B interfaces 14, 16 can use the buffer areas 22a, 22b in the RAM 22 to minimize any timing interactions during communication.

The processor interface 18 provides external access to the contents of the RAM 22, to control registers for setting the direction of data flow, and to other miscellaneous functions.

The DC machine 12 implements a variation of the well known and published Lempel-Ziv data compression algorithm. The algorithm uses predefined codewords to represent single-character strings; these predetermined codewords, also called "encoded characters" or "root codewords," are equal to the single character's binary value added to 08H. (This leaves binary values 00H through 07H available for control codes to modify operation during decompression.) Additional codewords representing multi-character strings are inserted into the dictionary as the input data stream is processed.

Figure 2:
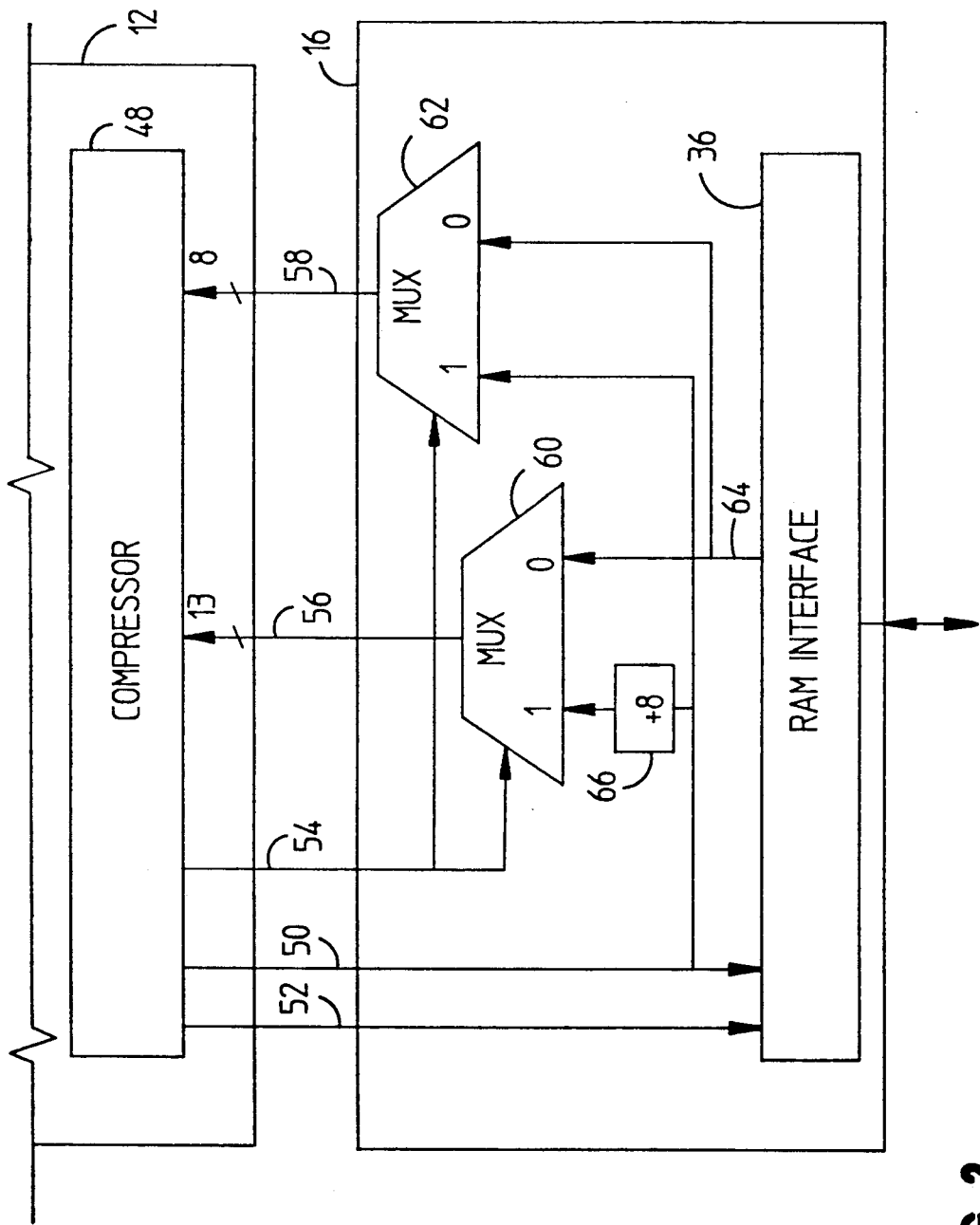
FIG. 2 is a partial detail block diagram of the data compression chip of FIG. 1 during compression.

Refer now to FIG. 2 where a portion of the DC IC is shown in more detail, specifically, the DC machine 12 and the Port B interface 16. During compression, a compressor 48 in the DC machine delivers requests for dictionary entries to the Port B interface using address line 50, miscellaneous control lines 52, and root control lines 54. The compressor expects the return codeword to be on codeword lines 56 and a character on character lines 58.

If the compressor 48 needs a codeword representing a multiple-character string (it knows whether or not the required codeword is a root codeword by the state it's in), the compressor hashes an address for the string and places it on the address lines 50 and deactivates the root control line 54. A codeword MUX 60 puts the data present at its "0" input (as controlled by the root control line) on the codeword lines 56. Likewise, the character MUX puts the character from its "0" input on the character lines 58. Both MUXes 60 and 62 receive their "0" inputs from the data lines 64 which carry data from the codeword dictionary 22c.

When the compressor 48 needs a root codeword, the MUXes 60, 62 and a binary adder circuit 66 eliminate the need to hash an address for the character and access the dictionary RAM 22. The compressor puts the character on the address lines 50 and activates the root control line 54. The codeword MUX 60 puts the data present at its "1" input on the codeword lines 56; thus the codeword lines carry the character plus 08H. This is the codeword for a single-character string. Likewise, the character MUX puts the character from the address lines 50 on the character lines 58.

Figure 3:
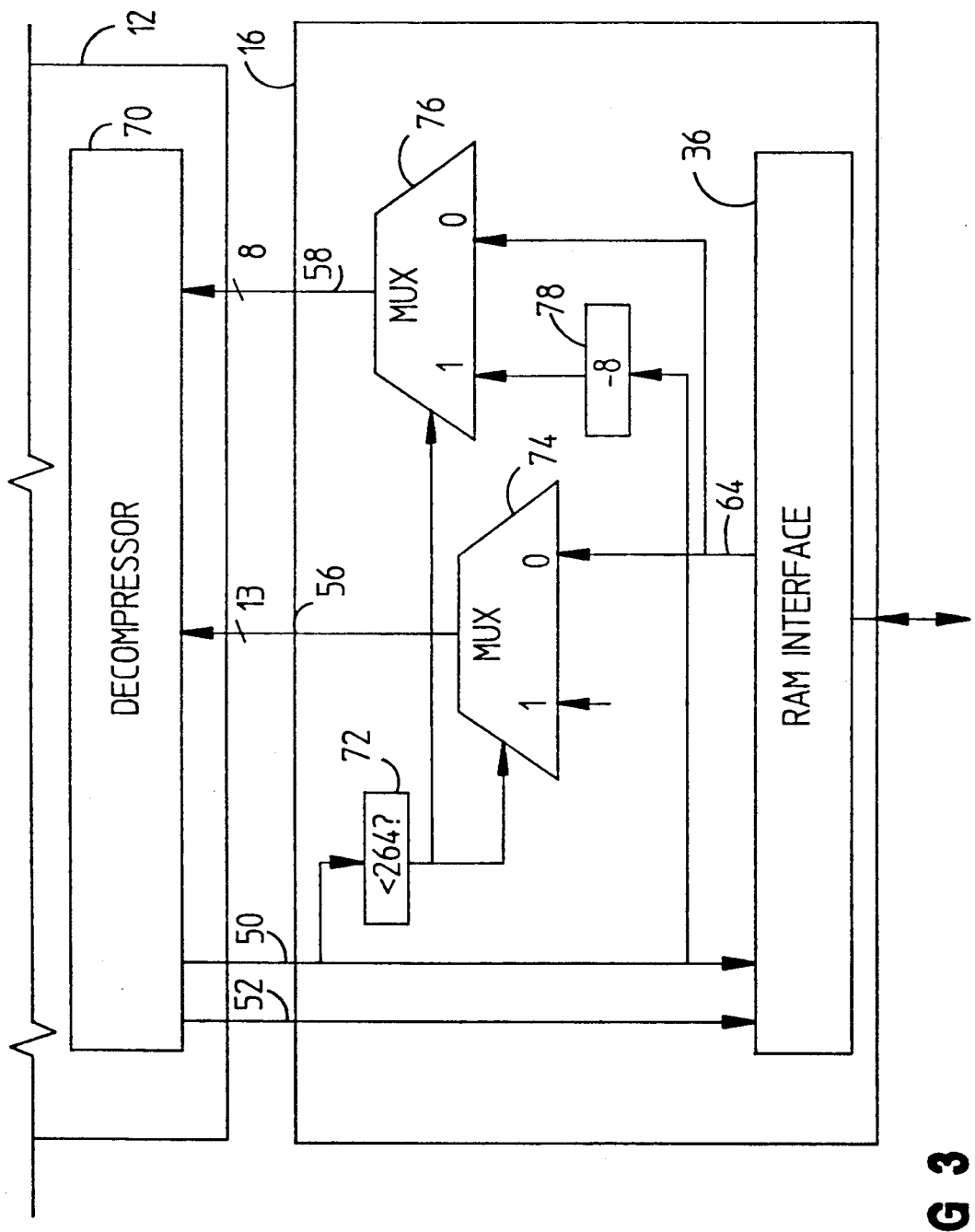
FIG. 3 is a partial detail block diagram of the data compression chip of FIG. 1 during decompression

Refer now to FIG. 3 where another portion of the DC IC is shown in more detail. During decompression, a decompressor 70 in the DC machine delivers requests for dictionary entries to the Port B interface using address line 50 and the miscellaneous control lines 52. The decompressor expects the return codeword to be on codeword lines 56 and a character on character lines 58.

When the decompressor 70 need a dictionary entry, it puts the codeword on the address lines 50. A root test circuit 72 determines if the codeword is less than 264, that is, if it is a root codeword. An affirmative answer to the test causes the MUXes 74 and 76 to provide their respective "1" inputs as outputs. As no codeword is necessary by the decompressor when decoding a root codeword, the "1" input to MUX 74 is not meaningful. The character lines 58 carry the codeword present on address lines 50 having 8 subtracted therefrom by subtraction circuit 78. This difference is equal to the single-character string represented by the root codeword.

If the codeword on the address lines is not less than 264, the codeword is not a root codeword and the decompressor needs a complete dictionary entry, that is, both a character on character lines 58 and a codeword on codeword lines 56. The complete dictionary entry is on the data lines 64 from the dictionary RAM 22c and is routed as required by the MUXes 74, 76.

Additional background information may be found in the MYSTIC Data Compression IC External Reference Specification, Revision 1.11, available from Hewlett-Packard Company as HP Part Number 1XB4-0301 which is hereby incorporated by reference.

It will be apparent that an embodiment which only compresses or only decompresses would also exhibit the advantages of the present invention. These and other variations and modifications on the described embodiments can be made on the present invention, the scope of which is limited only by the following claims.

We claim:

1. A system for compressing a character stream, comprising:
   (a) dictionary means for storing codewords;
   (b) compressor means for processing the character stream according to a predetermined adaptive compression strategy which substitutes codewords for both single-character strings and multiple-character strings, where the codewords for the multiple-character strings are selected during processing of the character stream, the compression strategy having a predetermined set of codewords for single-character strings, each of said codewords for single-character string being equal to a sum of a predetermined positive offset and a corresponding one of said single-character strings, said compressor means storing the selected codewords for multiple-character strings in said dictionary means; and (c) logic means, connected between said compressor means and said dictionary means, for generating one of said predetermined set of codewords for single-character strings in response to receiving a first single-character string and a control single from said compressor means by adding said predetermined positive offset to said first single-character strings.

2. A system for decompressing a codeword stream, comprising:

(a) dictionary means for storing codewords;
(b) decompressor means for processing the codeword stream according to a predetermined adaptive decompression strategy which substitutes both single-character nd multiple-character strings for codewords, where the codewords for the multiple-character strings are determined during processing of the codewords stream, the decompression strategy having a predetermined set of codewords for single-character strings, each of said codewords for said single-character strings being equal to a sum of a predetermined positive offset and a corresponding one of said single-character strings, said decompressor means storing the determined codewords for multiple-character strings in said dictionary means; and (c) logic means, connected between said decompressor means and said dictionary means for generating a single-character string corresponding to one of said predetermined set of codewords in response to receiving a first codeword from said decompressor means by subtracting said predetermined positive offset from said first codeword.

* * * * *

UNITED STATES PATENT AND TRADEMARK OFFICE
CERTIFICATE OF CORRECTION

PATENT NO.   : 5,142,282
DATED        : August 25, 1992
INVENTOR(S)  : Jeffrey P. Tobin et al It is certified that error appears in the above-indentified patent and that said Letters Patent is hereby corrected as shown below:

Column 5, claim 1, line 12, delete "single" (second occurrence) and insert therefor --signal--.

Column 6, claim 2, line 1, delete "nd" and insert therefor --and--.

Signed and Sealed this

Twenty-second Day of March, 1994

Attest:

BRUCE LEHMAN

Attesting Officer            Commissioner of Patents and Trademarks